United States Patent
Bae et al.

(10) Patent No.: US 11,889,741 B2
(45) Date of Patent: Jan. 30, 2024

(54) DISPLAY PANEL AND METHOD OF MANUFACTURING THE SAME

(71) Applicant: Samsung Display Co., Ltd., Yongin-si (KR)

(72) Inventors: Chulmin Bae, Yongin-si (KR); Eunjin Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 348 days.

(21) Appl. No.: 17/239,666

(22) Filed: Apr. 25, 2021

(65) Prior Publication Data

US 2022/0165996 A1    May 26, 2022

(30) Foreign Application Priority Data

Nov. 20, 2020  (KR) .................. 10-2020-0156920

(51) Int. Cl.
| | |
|---|---|
| *H01L 21/00* | (2006.01) |
| *H10K 71/00* | (2023.01) |
| *H10K 59/123* | (2023.01) |
| *H10K 59/131* | (2023.01) |
| *H10K 59/12* | (2023.01) |

(52) U.S. Cl.
CPC .......... *H10K 71/00* (2023.02); *H10K 59/123* (2023.02); *H10K 59/131* (2023.02); *H10K 59/1201* (2023.02)

(58) Field of Classification Search
CPC ..................................... H10K 71/00
See application file for complete search history.

(56) References Cited

U.S. PATENT DOCUMENTS

| | | | |
|---|---|---|---|
| 9,111,812 B2 | 8/2015 | Yoo et al. | |
| 2013/0105203 A1 | 5/2013 | Lee et al. | |
| 2014/0145587 A1* | 5/2014 | Yoon .............. | H01L 21/6835 428/354 |
| 2020/0328262 A1 | 10/2020 | Kawanago et al. | |

FOREIGN PATENT DOCUMENTS

| | | |
|---|---|---|
| CN | 106449711 | 2/2017 |
| JP | 2019-117291 | 7/2019 |
| KR | 10-1147988 | 5/2012 |
| KR | 10-2068093 | 1/2020 |
| KR | 10-2141229 | 8/2020 |

* cited by examiner

*Primary Examiner* — Douglas M Menz
(74) *Attorney, Agent, or Firm* — H.C. Park & Associates, PLC

(57) ABSTRACT

A method of manufacturing a display panel including: sequentially forming a first layer and a second layer on a carrier substrate such that bottom surfaces of the first layer and the second layer face the carrier substrate; forming a panel substrate including a first base layer on a top surface of the second layer such that a bottom surface of the first base layer faces the second layer; forming a display layer on the panel substrate; and separating the panel substrate from the second layer.

18 Claims, 12 Drawing Sheets

DISPLAY PANEL AND METHOD OF MANUFACTURING THE SAME

CROSS-REFERENCE TO RELATED APPLICATION

This application claims priority from and the benefit of Korean Patent Application No. 10-2020-0156920, filed on Nov. 20, 2020, which is hereby incorporated by reference for all purposes as if fully set forth herein.

BACKGROUND

Field

Embodiments of the invention relate generally to a display panel and a method of manufacturing the same, and, more particularly, to a display panel manufactured on a carrier substrate, and a method of manufacturing the display panel.

Discussion of the Background

Recently, the usage of display apparatuses has diversified. In addition, as display apparatuses have become thinner and lighter, their range of use has gradually been extended.

As the area occupied by a display area in display apparatuses expands, various functions that are combined or associated with display apparatuses have been added. In order to add various functions while expanding the display area, research is being carried out on display apparatuses having a region for performing various functions as well as displaying an image inside the display area.

In a display panel and a method of manufacturing the same according to the related art, a portion of a panel substrate is transformed or damaged during a process of separating the panel substrate from a carrier substrate.

The above information disclosed in this Background section is only for understanding of the background of the inventive concepts, and, therefore, it may contain information that does not constitute prior art.

SUMMARY

One or more embodiments include a display panel in which a panel substrate may be prevented from being transformed or damaged, and a method of manufacturing the display panel. However, such a technical problem is merely an example, and the inventive concepts are not limited thereto.

Additional features will be set forth in part in the description which follows and, in part, will be apparent from the description, or may be learned by practice of the presented embodiments.

According to one or more embodiments, a method of manufacturing a display panel includes sequentially forming a first layer and a second layer on a carrier substrate such that bottom surfaces of the first layer and the second layer face the carrier substrate, forming a panel substrate including a first base layer on a top surface of the second layer such that a bottom surface of the first base layer faces the second layer, forming a display layer on the panel substrate, and separating the panel substrate from the second layer.

The separating of the panel substrate may include detaching the bottom surface of the first base layer from the top surface of the second layer.

The detaching of the bottom surface of the first base layer may include irradiating a laser beam to a bottom surface of the carrier substrate.

The irradiating of the laser beam may include absorbing, at the first layer, at least a portion of energy of the laser beam, and transferring the energy of the laser beam in which the at least a portion thereof is absorbed, to the first base layer.

An absorbance of the first layer may be greater than an absorbance of the first base layer.

The first layer may include amorphous silicon.

The first base layer may include a transparent polyimide resin.

The laser beam may be a solid-state laser beam.

Bonding force between the second layer and the first base layer may be less than bonding force between the first layer and the first base layer.

A dielectric constant of the second layer may be less than a dielectric constant of the first layer.

The second layer may include silicon oxide.

The separating of the panel substrate may include cutting an edge of the panel substrate in which the bottom surface of the first base layer of the panel substrate is detached from the top surface of the second layer, and separating the carrier substrate away from the panel substrate.

The sequentially forming of the first layer and the second layer may include forming the first layer and the second layer through chemical vapor deposition (CVD) inside the same chamber.

An area of the first layer may be a same as an area of the second layer.

The first base layer may cover the second layer, and an area of the first base layer may be greater than an area of the second layer.

The panel substrate may include a first display area, a second display area, and a non-display area, the second display area including transmissive areas, and the display layer may include a first pixel electrode over the panel substrate in the first display area, and a second pixel electrode over the panel substrate in the second display area.

The display layer may further include at least one insulating layer, and the at least one insulating layer may include an opening corresponding to the transmissive areas.

The display layer may further include a first thin-film transistor arranged over the panel substrate in the first display area, electrically connected to the first pixel electrode, and including a first semiconductor layer and a first gate electrode, and a second thin-film transistor arranged over the panel substrate in the second display area, electrically connected to the second pixel electrode, and including a second semiconductor layer and a second gate electrode.

The display layer may further include a first thin-film transistor arranged over the panel substrate in the first display area, electrically connected to the first pixel electrode, and including a first semiconductor layer and a first gate electrode, a second thin-film transistor arranged over the panel substrate in the non-display area, and including a second semiconductor layer and a second gate electrode, and a connection wiring electrically connecting the second thin-film transistor to the second pixel electrode.

According to one or more embodiments, a display panel may be manufactured through one of the above methods.

These general and specific aspects may be implemented by using a system, a method, a computer program, or a combination of a certain system, method, and computer program.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
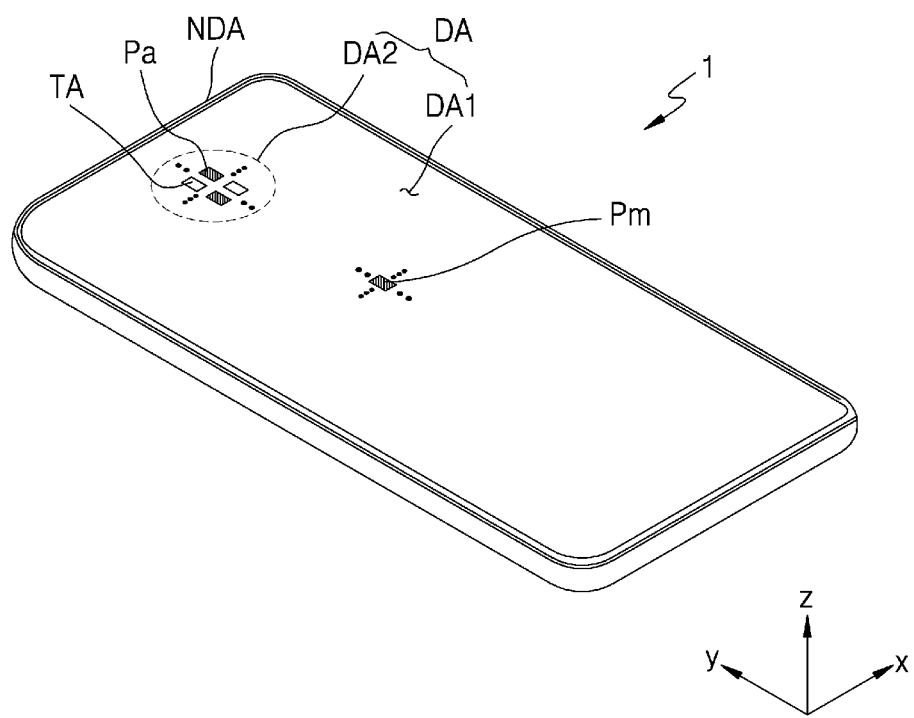
FIG. 1 is a perspective view of a portion of a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

When an embodiment may be implemented differently, a certain process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments will be described with reference to the accompanying drawings.

FIG. 1 is a perspective view of a portion of a display apparatus 1 according to an embodiment.

As shown in FIG. 1, the display apparatus 1 according to an embodiment may include a display area DA and a non-display area NDA.

The display area DA may include a first display area DA1 and a second display area DA2, first sub-pixels Pm being arranged in the first display area DA1, and second sub-pixels Pa being arranged in the second display area DA2. In addition, the second display area DA2 may include a transmission area TA in which the second sub-pixels Pa are not arranged. The first display area DA1 may surround at least a portion of the second display area DA2. As an example, the first display area DA1 may surround the second display area DA2 entirely. The first display area DA1 and the second display area DA2 may display an image individually or together. The non-display area NDA is an area in which display elements are not arranged and may be an area in which an image is not displayed. The non-display area NDA may surround at least a portion of the display area DA. As an example, the non-display area NDA may entirely surround the display area DA.

When the display apparatus 1 includes the first display area DA1, the second display area DA2, and the non-display area NDA, it may be understood that a panel substrate 100 (see FIG. 2) of the display apparatus 1 includes the first display area DA1, the second display area DA2, and the non-display area NDA.

Though it is shown in FIG. 1 that, in a view in a direction approximately perpendicular to the top surface of the display apparatus 1, the one second display area DA2 having an approximately circular shape is arranged at the center on the upper side (a +y-direction) inside the first display area DA1 to be entirely surrounded by the first display area DA1, the inventive concepts are not limited thereto. In an embodiment, the second display area DA2 may be arranged on the upper right side or the upper left side inside the first display area DA1. In addition, the second display area DA2 may be arranged in a bar or a notch-type on one side of the display apparatus 1. In this case, one edge of the second display area DA2 may coincide with one edge of the first display area DA1. In another embodiment, the display apparatus 1 may include a plurality of second display areas DA2. The plurality of second display areas DA2 may have different shapes and different sizes. As an example, in a view in a direction approximately perpendicular to the top surface of the display apparatus 1, the second display area DA2 may have various shapes, such as a circular shape, an elliptical shape, or a polygonal shape, including a quadrangle, a star shape, or a diamond shape.

The display apparatus 1 may include the plurality of first sub-pixels Pm and the plurality of second sub-pixels Pa, the plurality of first sub-pixels Pm being arranged in the first display area DA1, and the plurality of second sub-pixels Pa being arranged in the second display area DA2.

The plurality of second sub-pixels Pa arranged in the second display area DA2 may emit light to display a preset image. An image displayed in the second display area DA2 may have a resolution less than a resolution of an image displayed in the first display area DA1. As an embodiment, the second display area DA2 includes the transmission areas TA through which light and/or sound may pass. Sub-pixels may not be arranged in the transmission areas TA. Accordingly, the number of second sub-pixels Pa that may be arranged per unit area in the second display area DA2 may be less than the number of first sub-pixels Pm arranged per unit area in the first display area DA1.

Hereinafter, an organic light-emitting display apparatus is described as an example of the display apparatus 1 according to an embodiment. However, the display apparatus according to the inventive concepts is not limited thereto. That is, the display apparatus 1 according to an embodiment may be a display apparatus such as an inorganic light-emitting display or a quantum-dot light-emitting display. As an example, an emission layer of a display element of the display apparatus 1 may include an organic material or an inorganic material. In addition, the display apparatus 1 may include quantum dots, an organic material and quantum dots, or an inorganic material and quantum dots.

Figure 2:
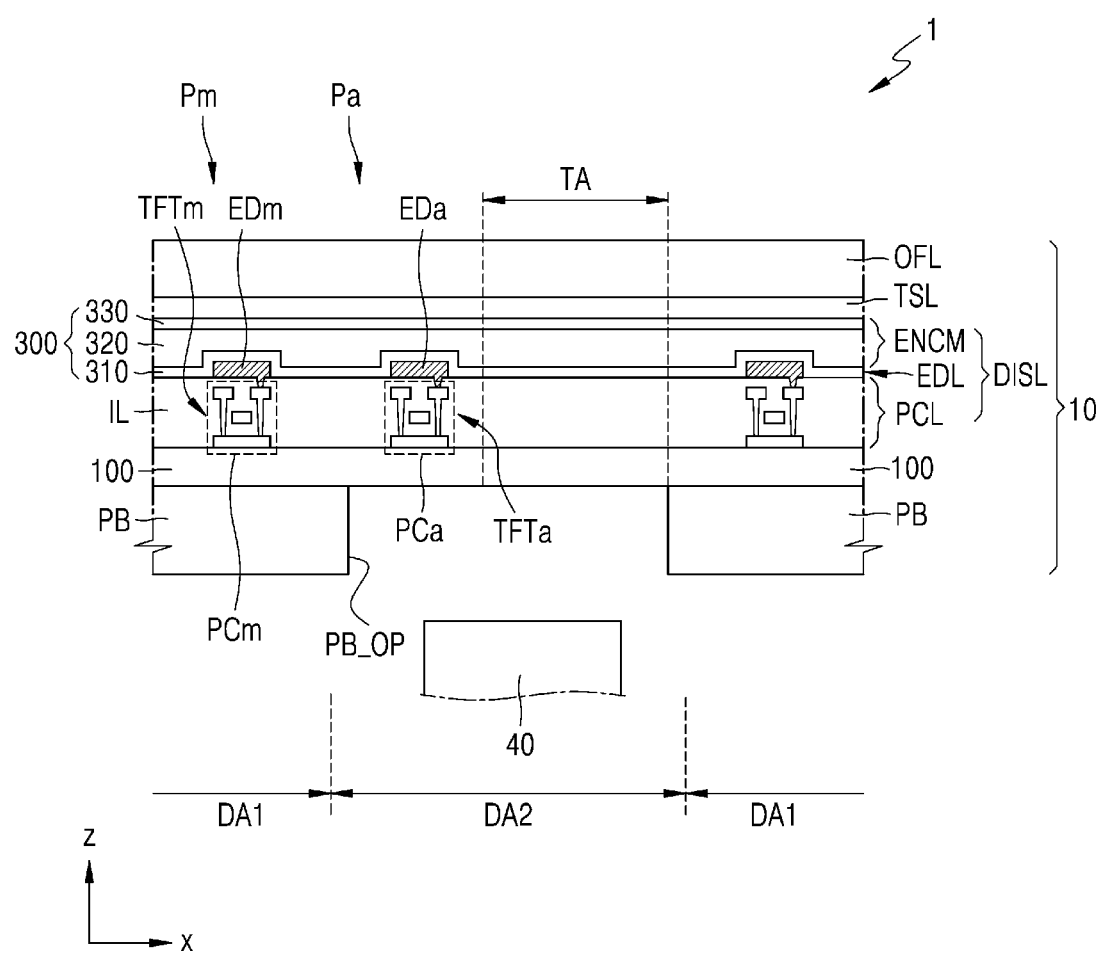
FIG. 2 is a cross-sectional view of a portion of a display apparatus according to an embodiment.

FIG. 2 is a cross-sectional view of a portion of the display apparatus 1 according to an embodiment.

As shown in FIG. 2, the display apparatus 1 may include a display panel 10 and a component 40 overlapping the display panel 10. In addition, the display apparatus 1 may further include a cover window (not shown) arranged on the display panel 10 to protect the display panel 10.

The component 40 may be an electronic element arranged below the display panel 10 to correspond to the second display area DA2. In an embodiment, the component 40 may be an electronic element that uses light and/or sounds. As an example, the component 40 may be a sensor that measures a distance, such as a proximity sensor, or a sensor that recognizes a portion of a user's body, such as a fingerprint, an iris, or a face. In addition, the component 40 may be a small lamp that outputs light or an image sensor that captures an image.

In the case where the component 40 is an electronic element that uses light, the component 40 may use light in various wavelength bands such as visible light, infrared light, or ultraviolet light. The component 40 may be an electronic element that uses ultrasonic waves or sounds in other frequency bands. In an embodiment, the component 40 may include sub-components, such as a light emitter and a light receiver. The light emitter and the light receiver may be provided in an integrated structure, or a pair of a light emitter and a light receiver having a physically separated structure may constitute one component 40. To prevent the function of the component 40 from being limited, the second display area DA2 may include transmission areas TA through which light and/or sound output from the component 40 to the outside, or progressing toward the component 40 from the outside may pass.

The display panel 10 may include the second display area DA2 and the first display area DA1, the second display area DA2 being an area that overlaps the component 40, and the first display area DA1 surrounding at least a portion of the second display area DA2. The display panel 10 may include the panel substrate 100, a display layer DISL, a functional layer, and a panel-protecting member PB, the display player DISL being on the panel substrate 100, the functional layer being arranged on the display layer DISL, and the panel-protecting member PB being arranged under the panel substrate 100. Though it is shown in FIG. 2 that a touch-screen layer TSL and an optical functional layer OFL are provided as an example of the functional layer, the inventive concepts are not limited thereto and various functional layers may be arranged depending on the design. In addition, the functional layer may be omitted.

The display layer DISL may include a circuit layer PCL, a display element layer EDL, and an encapsulation member ENCM. The circuit layer PCL may include thin-film transistors. In an embodiment, the circuit layer PCL may include at least one first thin-film transistor TFTm and at least one second thin-film transistor TFTa, the at least one first thin-film transistor TFTm being arranged in the first display area DA1, and the at least one second thin-film transistor TFTa being arranged in the second display area DA2. The display element layer EDL may include a light-emitting element, which is a display element. In an embodiment, the display element layer EDL may include at least one first light-emitting element EDm and at least one second light-emitting element EDa, the at least one first light-emitting element EDm being arranged in the first display area DA1, and the at least one second light-emitting element EDa being arranged in the second display area DA2. The encapsulation member ENCM may include an encapsulation layer 300 and/or an encapsulation substrate. An insulating layer IL may be arranged inside the display layer DISL, etc.

The panel substrate 100 may include an insulating material, such as glass, quartz, and a polymer resin. The panel substrate 100 may be a rigid substrate or a flexible substrate that is bendable, foldable, or rollable.

The first sub-pixel Pm may be arranged over the panel substrate 100 in the first display area DA1. In an embodiment, a first light-emitting element EDm and a first pixel circuit PCm may be arranged over the panel substrate 100 in the first display area DA1, the first light-emitting element EDm being included in the first sub-pixel Pm, and the first pixel circuit PCm being electrically connected to the first light-emitting element EDm. The first pixel circuit PCm may include at least one first thin-film transistor TFTm and control an operation of the first light-emitting element EDm.

The second sub-pixel Pa may be arranged over the panel substrate 100 in the second display area DA2. In an embodiment, the second light-emitting element EDa and the second pixel circuit PCa may be arranged over the panel substrate 100 in the second display area DA2, the second light-emitting element EDa being included in the second sub-pixel Pa, and the second pixel circuit PCa being electrically connected to the second light-emitting element EDa. The second pixel circuit PCa may include at least one second thin-film transistor TFTa and control an operation of the second light-emitting element EDa.

An area of the second display area DA2 in which the second light-emitting element EDa is not arranged may be defined as the transmission area TA.

The transmission area TA may be an area through which light and/or a signal emitted from the component 40 or light and/or a signal incident to the component 40 passes, the component 40 being arranged to correspond to the second display area DA2. For convenience, though it is shown in FIG. 2 that one second pixel circuit PCa, one second light-emitting element EDa, and one transmission area TA are arranged in the second display area DA2, the inventive concepts are not limited thereto. A plurality of second pixel circuits PCa, a plurality of second light-emitting elements EDa, and a plurality of transmission areas TA may be arranged in the second display area DA2. In an embodiment, the second light-emitting elements EDa and the transmission areas TA may be alternately arranged in the second display area DA2. That is, the second light-emitting elements EDa may be arranged between the transmission areas TA in the second display area DA2.

The encapsulation layer 300 as the encapsulation member ENCM may be arranged on the display element layer EDL. In an embodiment, the encapsulation layer 300 may include at least one inorganic encapsulation layer and at least one organic encapsulation layer, each covering the display element layer EDL. As an example, as shown in FIG. 2, the encapsulation layer 300 may include a first inorganic encapsulation layer 310, a second inorganic encapsulation layer 330, and an organic encapsulation layer 320 therebetween.

The first inorganic encapsulation layer 310 and the second inorganic encapsulation layer 330 may include at least one inorganic insulating material from among silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The organic encapsulation layer 320 may include a polymer-based material. The polymer-based material may include a silicon-based resin, an acryl-based resin (e.g.

polymethylmethacrylate, poly acrylic acid, etc.), an epoxy-based resin, polyimide, and polyethylene. The first inorganic encapsulation layer 310, the organic encapsulation layer 320, and the second inorganic encapsulation layer 330 may each be formed as one body to cover the first display area DA1 and the second display area DA2.

However, the inventive concepts are not limited thereto, and the display panel 10 may include an encapsulation substrate (not shown) as the encapsulation member ENCM arranged on the display element layer EDL. In this case, the encapsulation substrate may face the panel substrate 100 with the display element layer EDL therebetween. There may be a gap between the encapsulation substrate and the display element layer EDL. The encapsulation substrate may include glass. A sealant may be arranged between the panel substrate 100 and the encapsulation substrate, and the sealant may include frit. The sealant may be arranged in the non-display area NDA. The sealant arranged in the non-display area NDA may prevent moisture from penetrating into the display area DA through the lateral surface of the display apparatus while surrounding the display area DA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input through a self-capacitive method or a mutual capacitive method.

The touchscreen layer TSL may be arranged on the encapsulation member ENCM. In an embodiment, the touchscreen layer TSL may be separately formed on a touch substrate and then bonded on the encapsulation layer 300 through an adhesive layer such as an optically clear adhesive. In another embodiment, the touchscreen layer TSL may be directly formed on the encapsulation layer 300. In this case, the adhesive layer may not be arranged between the touchscreen layer TSL and the encapsulation layer 300.

The optical functional layer OFL may include an anti-reflection layer. The anti-reflection layer may reduce the reflectivity of light incident toward the display apparatus 1 from the outside. As an example, the optical functional layer OFL may be a polarizing film. In an embodiment, the optical functional layer OFL may include an opening (not shown) corresponding to the transmission area TA. Accordingly, a light transmittance of the transmission area TA may be remarkably improved. The opening may be filled with a transparent material, such as an optically clear resin (OCR). Alternatively, the optical functional layer OFL may be implemented by a filter plate including a black matrix and color filters.

The panel-protecting member PB may be attached under the panel substrate 100 to support and protect the panel substrate 100. The panel-protecting member PB may include an opening PB_OP corresponding to the second display area DA2. Because the panel-protecting member PB includes the opening PB_OP, a light transmittance of the second display area DA2 may be increased. The panel-protecting member PB may include polyethylene terephthalate or polyimide. In an embodiment, the panel-protecting member PB may not include the opening PB_OP. In addition, the panel-protecting member PB may be omitted.

There is no limitation in the area of the second display area DA2 and an area in which the component 40 is arranged. As an example, the area of the second display area DA2 may be greater than or less than the area in which the component 40 is arranged. The area of the second display area DA2 may be the same as the area in which the component 40 is arranged. Accordingly, the area of the opening PB_OP of the panel-protecting member PB may not coincide with the area of the second display area DA2.

Though FIG. 2 shows that the component 40 is arranged on one side of the display panel 10 and is apart from the display panel 10, at least a portion of the component 40 may be inserted into the opening PB_OP of the panel-protecting member PB.

In addition, a plurality of components 40 may be arranged in the second display area DA2. In this case, the components 40 may have different functions. As an example, the components 40 may include at least two of a camera (a photographing element), a solar battery, a flash, a proximity sensor, a luminance sensor, and an iris sensor.

The display panel 10 may be provided to various electronic apparatuses such as mobile phones, tablet personal computers, notebook computers, and smartwatches.

Figure 3:
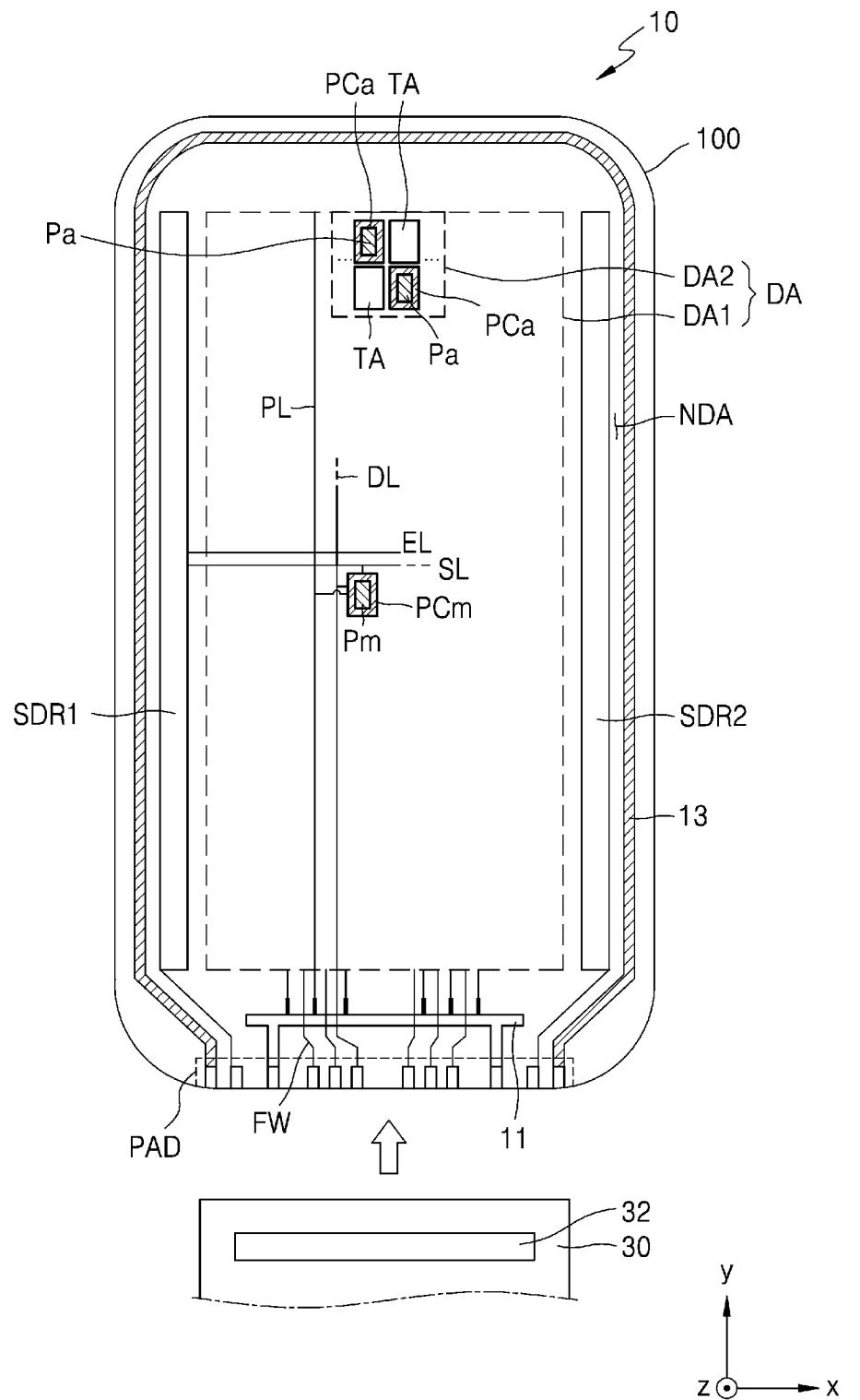
FIG. 3 is a plan view of a portion of a display panel of a display apparatus according to an embodiment.

FIG. 3 is a plan view of a portion of the display panel 10 of the display apparatus 1 according to an embodiment.

Referring to FIG. 3, elements constituting the display panel 10 may be arranged on the panel substrate 100.

The plurality of first sub-pixels Pm may be arranged in the first display area DA1. Each of the first sub-pixels Pm may be implemented by a display element such as an organic light-emitting diode OLED. The first pixel circuit PCm that drives the first sub-pixel Pm may be arranged in the first display area DA1 and may overlap the first sub-pixel Pm. Each first sub-pixel Pm may emit, for example, red, green, blue, or white light. The first display area DA1 may be covered by the encapsulation member ENCM (see FIG. 2), and thus, protected from external air or moisture.

As described above, the second display area DA2 may be arranged on one side of the first display area DA1 or arranged inside the display area DA and surrounded by the first display area DA1. The plurality of second sub-pixels Pa may be arranged in the second display area DA2. Each of the second sub-pixels Pa may be implemented by a display element such as an organic light-emitting diode OLED. The second pixel circuit PCa that drives the second sub-pixel Pa may be arranged in the second display area DA2 and may overlap the second sub-pixel Pa. Each second sub-pixel Pa may emit, for example, red, green, blue, or white light. The second display area DA2 may be covered by the encapsulation member ENCM (see FIG. 2) together with the first display area DA1, and thus, protected from external air or moisture.

As described above, the second display area DA2 may include the transmission areas TA. The transmission areas TA may be arranged to surround the plurality of second sub-pixels Pa. Alternatively, the transmission areas TA may be arranged in a lattice shape with the plurality of second sub-pixels Pa. Because the second display area DA2 includes the transmission areas TA, the resolution of the second display area DA2 may be less than the resolution of the first display area DA1. As an example, the resolution of the second display area DA2 may be about ½, ⅜, ⅓, ¼, ⅖, ⅛, ⅑, or 1/16 of the resolution of the first display area DA1.

The pixel circuits, that is, the first pixel circuit PCm and the second pixel circuit PCa that drive the sub-pixels, that is, the first sub-pixel Pm and the second sub-pixel Pa may each be electrically connected to outer circuits arranged in the non-display area NDA. A first scan driving circuit SDR1, a second scan driving circuit SDR2, a pad portion PAD, a driving voltage supply line 11, and a common voltage supply line 13 may be arranged in the non-display area NDA.

The first scan driving circuit SDR1 and the second scan driving circuit SDR2 may be arranged symmetrically with respect to the first display area DA1. The first scan driving circuit SDR1 and the second scan driving circuit SDR2 may apply a scan signal to the first pixel circuit PCm through a scan line SL, the first pixel circuit PCm driving the first sub-pixel Pm. In addition, the first scan driving circuit SDR1 and the second scan driving circuit SDR2 may apply an emission control signal to each pixel circuit through an emission control line EL. Some of the first pixel circuits PCm of the first sub-pixels Pm in the first display area DA1 may be electrically connected to the first scan driving circuit SDR1, and the rest of the first pixel circuits PCm may be electrically connected to the second scan driving circuit SDR2.

The pad portion PAD may be arranged on one side of the panel substrate 100. The pad portion PAD may be electrically connected to a display circuit board 30 by being exposed by not being covered by an insulating layer. A display driver 32 may be arranged on the display circuit board 30.

The display driver 32 may generate a control signal to be transferred to the first scan driving circuit SDR1 and the second scan driving circuit SDR2. The display driver 32 may generate a data signal. The generated data signal may be transferred to the first pixel circuit PCm through a fan-out wiring FW and a data line DL connected to the fan-out wiring FW.

The display driver 32 may supply a driving voltage ELVDD to the driving voltage supply line 11 and supply a common voltage ELVSS to the common voltage supply line 13. The driving voltage ELVDD may be applied to the pixel circuits of the sub-pixels, that is, the first sub-pixel Pm and the second sub-pixel Pa through the driving voltage line PL connected to the driving voltage supply line 11. The common voltage ELVSS may be connected to the common voltage supply line 13 and applied to an opposite electrode of a display element.

The driving voltage supply line 11 may extend in an x-direction in the bottom side of the display area DA1. The common voltage supply line 13 has a loop shape having one open side, and thus, may surround at least a portion of the first display area DA1.

Although FIG. 3 shows the case where one second display area DA2 is provided, the display panel 10 may include a plurality of second display areas DA2. In this case, the plurality of second display areas DA2 may be spaced apart from each other. A first camera may be arranged to correspond to one second display area DA2, and a second camera may be arranged to correspond to another second display area DA2. Alternatively, a camera may be arranged to correspond to one second display area DA2, and an infrared sensor may be arranged to correspond to another second display area DA2. In addition, the plurality of second display areas DA2 may have different shapes and different sizes.

Figure 4:
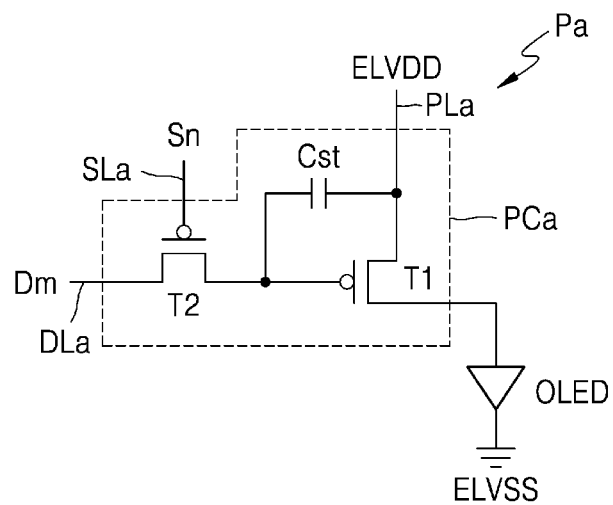
FIG. 4 is an equivalent circuit diagram of a pixel circuit of a display panel according to an embodiment.

FIG. 4 is an equivalent circuit diagram of a pixel circuit of a display panel according to an embodiment.

Referring to FIG. 4, a second sub-pixel Pa includes the second pixel circuit PCa and an organic light-emitting diode OLED as a display element connected to the second pixel circuit PCa. In addition, the first sub-pixel Pm may include the first pixel circuit PCm that is the same as/similar to the second pixel circuit PCa shown in FIG. 4 and an organic light-emitting diode OLED as a display element connected to the first pixel circuit PCm.

The second pixel circuit PCa includes a driving thin-film transistor T1, a switching thin-film transistor T2, and a storage capacitor Cst. The switching thin-film transistor T2 is connected to an auxiliary scan line SLa and an auxiliary data line DLa and configured to transfer a data signal Dm to the driving thin-film transistor T1 according to a scan signal Sn input through the auxiliary scan line SLa, the data signal Dm being input through the auxiliary data line DLa. The storage capacitor Cst may be connected to the switching thin-film transistor T2 and an auxiliary driving voltage line PLa and configured to store a voltage corresponding to a difference between a voltage transferred from the switching thin-film transistor T2 and a driving voltage ELVDD supplied to the auxiliary driving voltage line PLa.

The driving thin-film transistor T1 may be connected to the auxiliary driving voltage line PLa and the storage capacitor Cst and configured to control a driving current flowing to the organic light-emitting diode OLED from the auxiliary driving voltage line PLa according to the voltage stored in the storage capacitor Cst. The organic light-emitting diode OLED may emit light having a preset brightness level according to the driving current.

Though FIG. 4 shows the case where the second pixel circuit PCa includes two thin-film transistors and one storage capacitor, the inventive concepts are not limited thereto. In an embodiment, the second pixel circuit PCa may include seven thin-film transistors and one storage capacitor. In another embodiment, the second pixel circuit PCa may include two or more storage capacitors.

Figure 5:
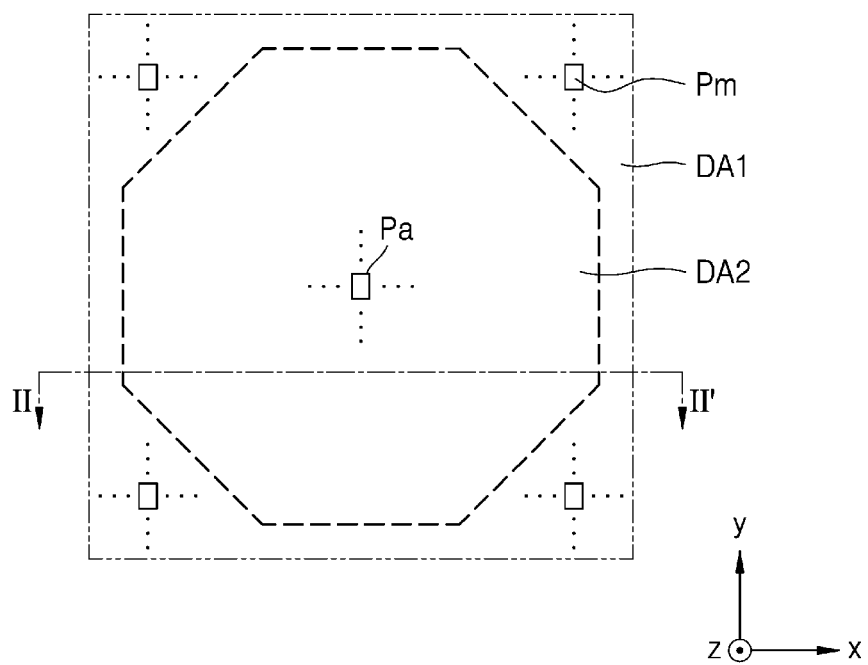
FIG. 5 is a plan view of a portion of a display panel according to an embodiment.

FIG. 5 is a plan view of a portion of a display panel according to an embodiment.

As shown in FIG. 5, the plurality of first sub-pixels Pm may be arranged in the first display area DA1, and the plurality of second sub-pixels Pa may be arranged in the second display area DA2. In addition, though not shown in FIG. 5, because the component 40 overlaps the second display area DA2 as described above, the second display area DA2 may overlap the transmission area TA.

The density of the second sub-pixels Pa in the second display area DA2 including the transmission area TA may be different from the density of the first sub-pixels Pm in the first display area DA1. As an example, in the same area, the number of pixels arranged in the second display area DA2 and/or an aperture ratio of the second display area DA2 may be less than the number of pixels arranged in the first display area DA1 and/or an aperture ratio of the first display area DA1.

Figure 6:
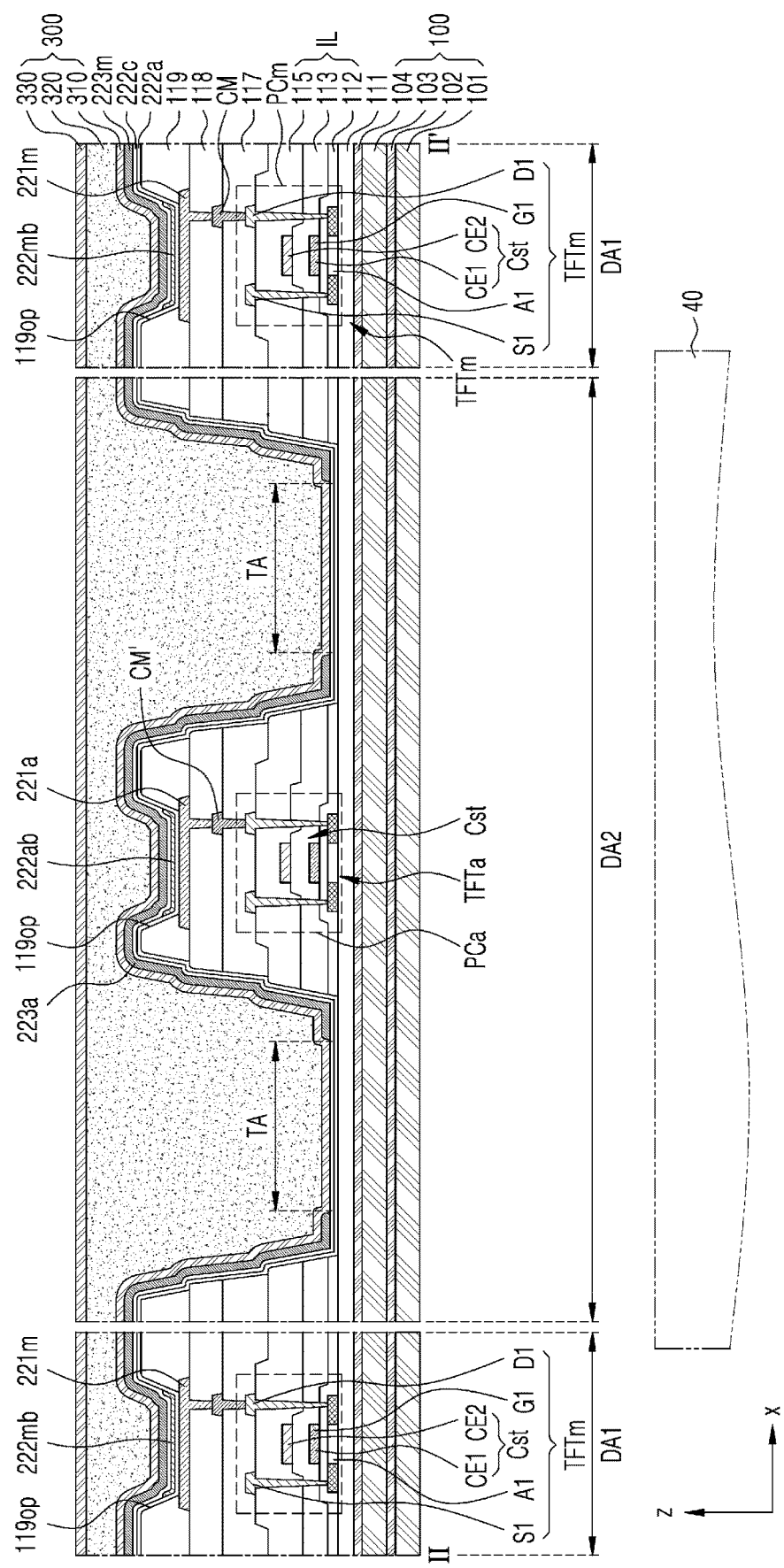
FIG. 6 is a cross-sectional view of a portion of a display panel according to an embodiment.

FIG. 6 is a cross-sectional view of a portion of the display panel 10 according to an embodiment. FIG. 6 may correspond to a cross-section of the display panel 10 taken along line II-II' of FIG. 5.

The panel substrate 100 may include the above-described various materials and have a multi-layered structure. In an embodiment, the panel substrate 100 may include at least one base layer and at least one barrier layer. In an embodiment, as shown in FIG. 6, the panel substrate 100 may include a first base layer 101, a first barrier layer 102 on the first base layer 101, a second base layer 103 on the first barrier layer 102, a second barrier layer 104 on the second base layer 103.

The panel substrate 100 may include a transparent polyimide resin to improve a transmittance of the transmission area TA. In an embodiment, because the base layer of the panel substrate 100 includes a transparent polyimide, the panel substrate 100 may have transparency. Here, "transparency" may be defined by a "yellowness index" (YI). As an example, a YI may be measured according to ASTM E313. A layer including a "transparent polyimide resin" or a "transparent polyimide resin" may denote a material or a layer in which a YI measured according to ASTM E313 is a specific value or less (e.g., 10 or less).

The base layer of the panel substrate 100 is a polyimide resin and may include a copolymer of a dianhydride compound and a diamine compound.

In an embodiment, a polyimide resin of the base layer of the panel substrate 100 may be a polymer compound including a repeated unit denoted by chemical formula 1 below.

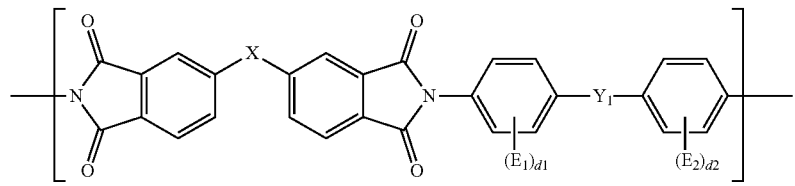

[chemical formula 1]

In chemical formula 1, X includes one of $C(CR_1R_2R_3)_2$, O, $SO_2$, and C=O. $R_1$ to $R_3$ independently include one of —F, —Cl, —Br, and —I. $Y_1$ includes one of a single bond, O and $SO_2$. $E_1$ and $E_2$ independently include hydrogen or $CF_3$. d1 and d2 independently are one of integers 1 to 4. Here, d1 and d2 are the number of $E_1$ and $E_2$, respectively. When d1 is 2 or more, $E_1$ may be the same or different from each other. When d2 is 2 or more, $E_2$ may be the same or different from each other.

In another embodiment, the polyimide resin may be a polymer compound including the repeated unit denoted by chemical formula 2 below.

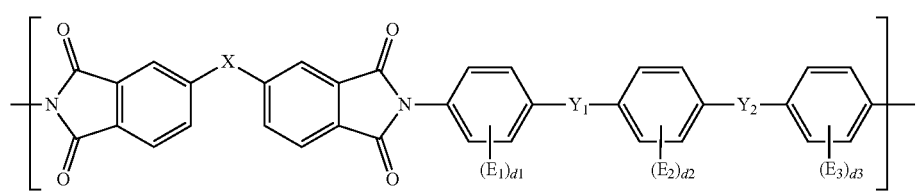

[chemical formula 2]

In chemical formula 2, X includes one of $C(CR_1R_2R_3)_2$, O, $SO_2$, and C=O. $R_1$ to $R_3$ independently include one of —F, —Cl, —Br, and —I. $Y_1$ includes one of a single bond, O and $SO_2$. $Y_2$ includes one of a single bond, O and $SO_2$. $E_1$ to $E_3$ independently include hydrogen or $CF_3$. d1 to d3 independently are one of integers 1 to 4. Here, d1 and d2 are the number of $E_1$ and $E_2$, respectively. When d1 is 2 or more, $E_1$ may be the same or different from each other. When d2 is 2 or more, $E_2$ may be the same or different from each other.

In another embodiment, the polyimide resin of the base layer of the panel substrate 100 may include a repeated unit denoted by chemical formula 1 and/or a repeated unit denoted by chemical formula 2, and thus, include repeated units of different structures of two or more kinds.

As a comparative example, the panel substrate 100 is a polyimide resin and may include a polymer compound including a repeated unit denoted by chemical formula 3 below.

[chemical formula 3]

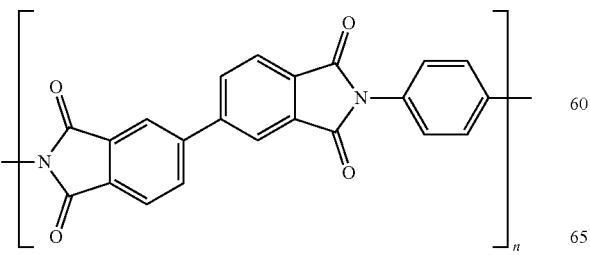

The panel substrate 100 including a polymer compound according to a comparative example changes an energy level while an electron present in a main chain of the polyimide makes a transition, and thus, absorbs light and may take on a yellow to dark brown color, which is a color scheme of the absorbed light. Accordingly, the panel substrate 100 according to a comparative example has a low YI (e.g., about 25), and thus, sufficient transparency cannot be secured.

In contrast, the display panel 10 according to an embodiment may secure transparency by including the panel substrate 100 including a transparent polyimide resin.

The first barrier layer 102 and the second barrier layer 104 may prevent penetration of an external foreign substance. The first barrier layer 102 and the second barrier layer 104 may include a single layer or a multi-layer including an inorganic material, such as silicon nitride, silicon oxynitride, and/or silicon oxide.

A buffer layer 111 may be arranged on the panel substrate 100. The buffer layer 111 may reduce or block penetration of a foreign substance, moisture, or external air from below the panel substrate 100 and planarize the top surface of the panel substrate 100. The buffer layer 111 may include an inorganic insulating material, such as silicon nitride, silicon oxynitride, and/or silicon oxide and include a single layer or a multi-layer including the above materials. The buffer layer 111 may be omitted.

Pixel circuits may be arranged over the panel substrate 100, the pixel circuits including thin-film transistors TFT and a storage capacitor Cst. The first pixel circuit PCm may be arranged in the first display area DA1 over the panel substrate 100. The second pixel circuit PCa may be arranged in the second display area DA2 over the panel substrate 100. The first pixel circuit PCm in the first display area DA1 may have the same structure as the second pixel circuit PCa in the second display area DA2.

In an embodiment, a bottom metal layer (not shown) may be arranged between the panel substrate 100 and the first pixel circuit PCm in the first display area DA1. In this case, the buffer layer 111 may cover the bottom metal layer and be arranged on the panel substrate 100. The bottom metal layer may overlap at least a portion of a first semiconductor layer A1 of the first thin-film transistor TFTm. Though this structure, the bottom metal layer may protect the first semiconductor layer A1 from external light. The bottom metal layer may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). In addition, the bottom metal layer may include a single layer or a multi-layer including the above material.

In the second display area DA2, a shield layer (not shown) may be arranged between the panel substrate 100 and the second pixel circuit PCa. In this case, the buffer layer 111 may cover the shield layer and be arranged on the panel substrate 100. The shield layer may prevent light emitted from the component 40 or progressing toward the component 40 from being diffracted through a narrow gap between wirings connected to the second pixel circuit PCa, and thus, may improve the performance of the second thin-film transistor TFTa. In addition, the shield layer may improve uniformity of reflectivity by removing a reflectivity difference between a region in which wirings including a metal material are arranged and the other regions. In addition, the shield layer may not be arranged in the transmission areas TA. As an example, the shield layer may have openings that overlap the transmission areas TA. That is, the openings of the shield layer may define the transmission areas TA of the second display area DA2.

The shield layer may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu). In addition, the bottom metal layer may include a single layer or a multi-layer including the above materials.

The first thin-film transistor TFTm of the first pixel circuit PCm in the first display area DA1 may include the first semiconductor layer A1, a first gate electrode G1, a first source electrode S1, and a first drain electrode D1, the first gate electrode G1 overlapping a channel region of the first semiconductor layer A1, and the first source electrode S1 and the first drain electrode D1 being respectively connected to a source region and a drain region of the first semiconductor layer A1. A gate insulating layer 112 may be arranged between the first semiconductor layer A1 and the first gate electrode G1. A first interlayer insulating layer 113 and a second interlayer insulating layer 115 may be arranged between the first gate electrode G1 and the first source electrode S1, or between the first gate electrode G1 and the first drain electrode D1.

The storage capacitor Cst may overlap the first thin-film transistor TFTm. The storage capacitor Cst may include a bottom electrode CE1 and a top electrode CE2 overlapping each other. In an embodiment, the first gate electrode G1 of the first thin-film transistor TFTm and the bottom electrode CE1 of the storage capacitor Cst may be provided as one body. The first interlayer insulating layer 113 may be arranged between the bottom electrode CE1 and the top electrode CE2.

The first semiconductor layer A1 may include polycrystalline silicon. In an embodiment, the first semiconductor layer A1 may include amorphous silicon. In an embodiment, the first semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include the channel region, the source region, and the drain region, the source region and the drain region being doped with impurities.

The gate insulating layer 112 may include an inorganic insulating material, such as silicon nitride, silicon oxynitride, or silicon oxide, and include a single layer or a multi-layer including the above materials.

The first gate electrode G1 or the bottom electrode CE1 may include a low-resistance conductive material, such as molybdenum (Mo), aluminum (Al), copper (Cu), and/or titanium (Ti), and have a single-layered structure or a multi-layered structure including the above materials. As an example, the first gate electrode G1 may have a three-layered structure of a molybdenum layer/an aluminum layer/a molybdenum layer.

The first interlayer insulating layer 113 may include an inorganic insulating material such as silicon nitride, silicon oxynitride, or silicon oxide and include a single-layered structure or a multi-layered structure including the above materials.

The top electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered structure or a multi-layered structure including the above materials.

The second interlayer insulating layer 115 may include an inorganic insulating material, such as silicon nitride, silicon oxynitride, or silicon oxide, and include a single-layered structure or a multi-layered structure including the above materials.

The first source electrode S1 or the first drain electrode D1 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered structure or a multi-layered structure including the above materials. As an example, the first source electrode S1 or the first drain electrode D1 may have a three-layered structure of a titanium layer/an aluminum layer/a titanium layer.

The first pixel circuit PCm may be electrically connected to a first pixel electrode 221m in the first display area DA1, the first pixel circuit PCm including the first thin-film transistor TFTm and the storage capacitor Cst, and the first pixel electrode 221m being arranged over the panel substrate 100. As an example, as shown in FIG. 6, the first pixel circuit PCm may be electrically connected to the first pixel electrode 221m through a contact metal CM, which is a connection wiring.

The contact metal CM may be arranged on a first planarization layer 117 and connected to the first pixel circuit PCm through a contact hole formed in the first planarization layer 117. The contact metal CM may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered structure or a multi-layered structure including the above materials.

The first planarization layer 117 may include an organic insulating material. As an example, the first planarization layer 117 may include an organic insulating material, such as benzocyclobutene (BCB), polyimide, or hexamethyldisiloxane (HMDSO). The organic insulating material of the first planarization layer 117 may be a photosensitive organic insulating material.

The contact metal CM is arranged on a second planarization layer 118. The second planarization layer 118 may include an organic insulating material. The second planarization layer 118 may include an organic insulating material, such as benzocyclobutene (BCB), polyimide, or hexamethyldisiloxane (HMDSO). The organic insulating material of the second planarization layer 118 may be a photosensitive organic insulating material.

The first pixel electrode 221m may be arranged on the second planarization layer 118. The first pixel electrode 221m may be connected to the contact metal CM through a contact hole of the second planarization layer 118.

The first pixel electrode 221m may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The first pixel electrode 221m may include a reflective layer and a transparent conductive layer on and/or under the reflective layer, the reflective layer including the above materials. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). As an example, the first pixel electrode 221m may include a three-layered structure of an ITO layer/a Ag layer/an ITO layer that are sequentially stacked.

Up to this point, though description has been made to the first pixel circuit PCm and the first pixel electrode 221m arranged in the first display area DA1, the description is applicable to the second pixel circuit PCa and the second pixel electrode 221a arranged in the second display area DA2. That is, the second thin-film transistor TFTa of the second pixel circuit PCa arranged in the second display area DA2 may have a structure that is the same as/similar to the structure of the first thin-film transistor TFTm of the first pixel circuit PCm. The second pixel electrode 221a arranged in the second display area DA2 may have a structure that is the same as or similar to the structure of the first pixel electrode 221m. FIG. 6 shows that the second pixel electrode 221a is electrically connected to the second thin-film transistor TFTa through a contact metal CM', which is a connection wiring, the second thin-film transistor TFTa including a second semiconductor layer and a second gate electrode. The above description of the contact metal CM is applicable to the contact metal CM'.

A pixel-defining layer 119 may be arranged on the first pixel electrode 221m and the second pixel electrode 221a. The pixel-defining layer 119 may cover the edges of the first pixel electrode 221m and the edges of the second pixel electrode 221a and include openings 119op respectively overlapping the central portions of the first pixel electrode 221m and the second pixel electrode 221a. The pixel-defining layer 119 may include an organic insulating material such as polyimide, polyamide, an acrylic resin, benzocyclobutene, HMDSO, or a phenolic resin.

A first functional layer 222a and a second functional layer 222c are arranged on the pixel-defining layer 119, the first pixel electrode 221m, and the second pixel electrode 221a. The first functional layer 222a and the second functional layer 222c may each entirely cover the first display area DA1 and the second display area DA2. In an embodiment, the first functional layer 222a and the second functional layer 222c may each have openings corresponding to the transmission areas TA.

The first functional layer 222a may include a single layer or a multi-layer. As an example, in the case where the first functional layer 222a includes a polymer material, the first functional layer 222a may include a hole transport layer (HTL), which has a single-layered structure, and include poly(3,4-ethylenedioxythiophene) (PEDOT) or polyaniline (PANI). In the case where the first functional layer 222a includes a low molecular weight material, the first functional layer 222a may include a hole injection layer (HIL) and a hole transport layer (HTL).

The second functional layer 222c may be omitted. As an example, in the case where the first functional layer 222a includes a polymer material, the second functional layer 222c may be arranged on the first functional layer 222a. The second functional layer 222c may include a single layer or a multi-layer. The second functional layer 222c may include an electron transport layer (ETL) and/or an electron injection layer (EIL).

A first emission layer 222mb or a second emission layer 222ab is arranged on the first functional layer 222a or between the first functional layer 222a and the second functional layer 222c. The first emission layer 222mb may have a shape patterned to correspond to the first pixel electrode 221m. The second emission layer 222ab may have a shape patterned to correspond to the second pixel electrode 221a. The first emission layer 222mb and the second emission layer 222ab may each include an organic material. The first emission layer 222mb and the second emission layer 222ab may each include a polymer organic material or a low molecular weight organic material that emits light having a preset color.

A second opposite electrode 223a is arranged on the second emission layer 222ab, the second opposite electrode 223a overlapping the second pixel electrode 221a. A first opposite electrode 223m is arranged on the first emission layer 222mb, the first opposite electrode 223m overlapping the first pixel electrode 221m. The second opposite electrode 223a and the first opposite electrode 223m may be provided as one body. The second opposite electrode 223a and the first opposite electrode 223m may include a conductive material having a relatively low work function. As an example, the second opposite electrode 223a and the first opposite electrode 223m may include a (semi) transparent layer including silver (Ag), magnesium (Mg), aluminum (Al), nickel (Ni), neodymium (Nd), iridium (Ir), chrome (Cr), lithium (Li), calcium (Ca), or an alloy thereof. Alternatively, the second opposite electrode 223a and the first opposite electrode 223m may further include a layer including ITO, IZO, ZnO, or $In_2O_3$ on the (semi) transparent layer including the above material. In an embodiment, the second opposite electrode 223a and the first opposite electrode 223m may include silver (Ag) and magnesium (Mg).

A stacking structure of the first pixel electrode 221m, the first emission layer 222mb, and the first opposite electrode 223m that are sequentially stacked may constitute a light-emitting diode, for example, an organic light-emitting diode OLED. In addition, a stacking structure of the second pixel electrode 221a, the second emission layer 222ab, and the second opposite electrode 223m may constitute a light-emitting diode, for example, an organic light-emitting diode OLED. The organic light-emitting diode OLED may emit red, green, or blue light. An emission area of each organic light-emitting diode OLED corresponds to a pixel. As an example, the first sub-pixel Pm corresponds to an emission area of an organic light-emitting diode OLED arranged in the first display area DA1. The second sub-pixel Pa corresponds to an emission area of an organic light-emitting diode OLED arranged in the second display area DA2. Because the opening 119op of the pixel-defining layer 119 defines the size and/or the width of the emission area, the size and/or the width of the first sub-pixel Pm and the second sub-pixel Pa may depend on the opening 119op of the pixel-defining layer 119.

As described above, the organic light-emitting diode OLED may be covered by the first inorganic encapsulation layer 310, the second inorganic encapsulation layer 330, and the organic encapsulation layer 320 therebetween.

Referring to FIG. 6, insulating layers on the panel substrate 100 may respectively include openings corresponding to the transmission areas TA. As an example, as shown in FIG. 6, the gate insulating layer 112, the first interlayer insulating layer 113, the second interlayer insulating layer 115, the first planarization layer 117, the second planarization layer 118, and the pixel-defining layer 119 may respectively include openings that correspond to the transmission areas TA and overlap each other.

Figure 7:
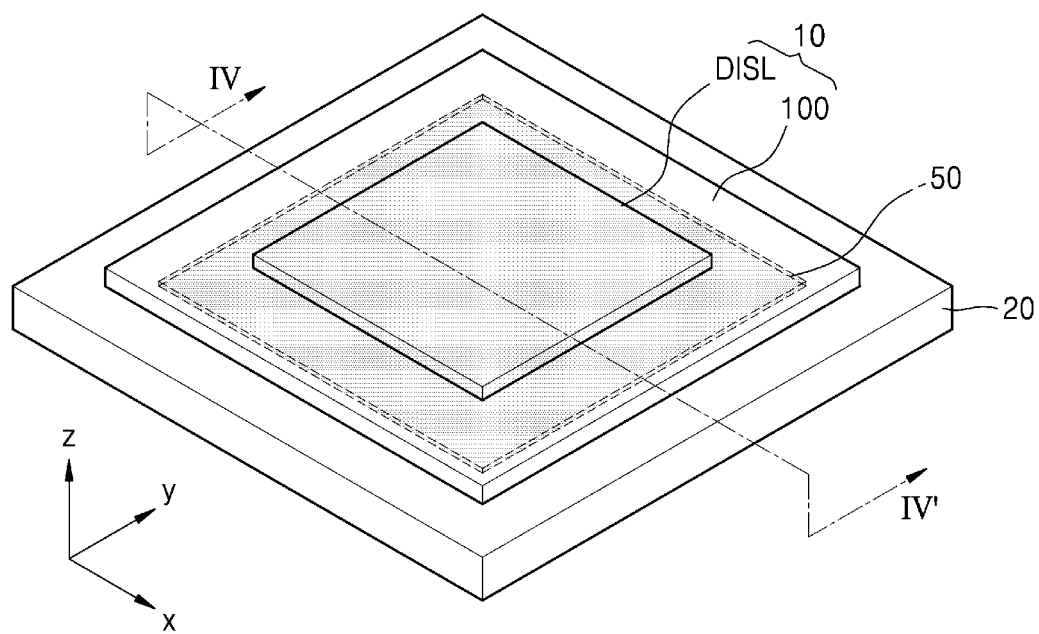
FIG. 7 is a perspective view of a portion of a display panel before the display panel is separated from a carrier substrate in a method of manufacturing the display panel according to an embodiment.
Figure 8:
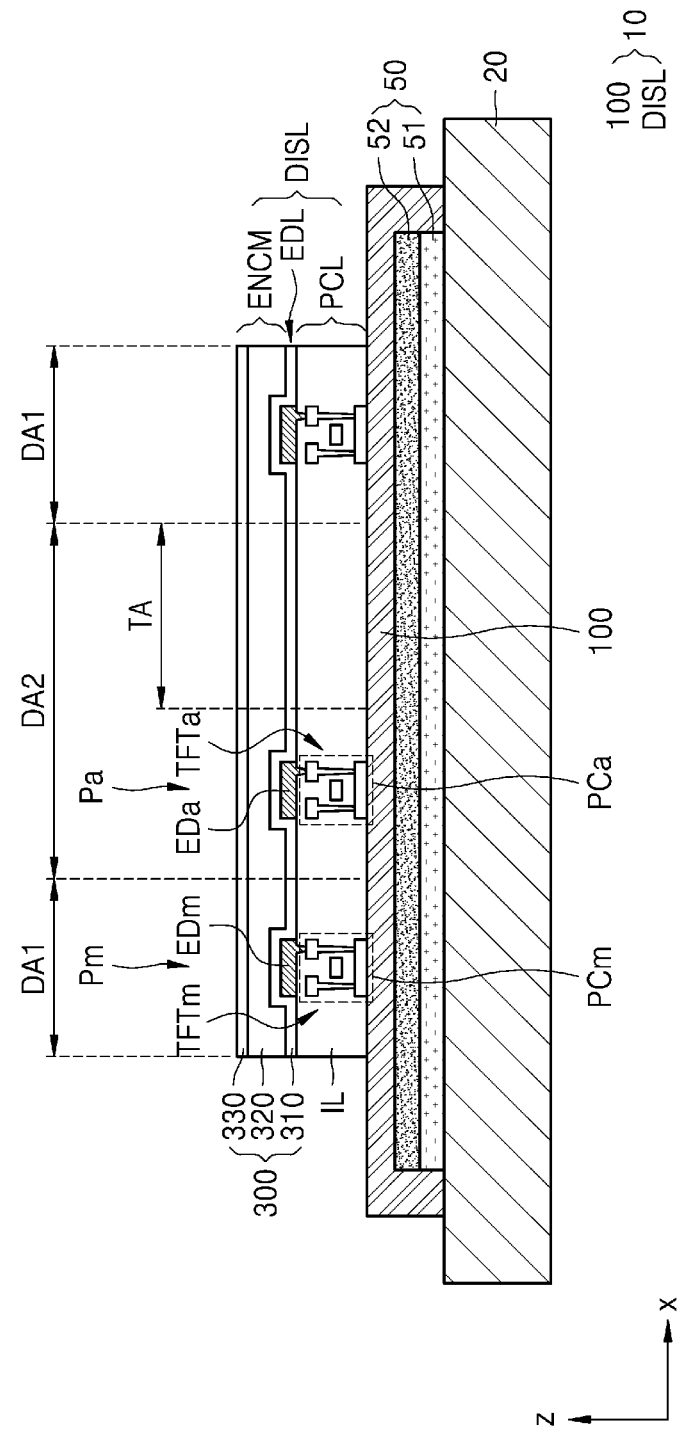
FIG. 8 is a cross-sectional view of a portion of a display panel before the display panel is separated from a carrier substrate in a method of manufacturing the display panel according to an embodiment.

FIGS. 7 and 8 are, respectively, a perspective view and a cross-sectional view of a portion of a display panel before the display panel is separated from a carrier substrate in a method of manufacturing the display panel according to an embodiment.

For reference, FIG. 8 may correspond to a cross-sectional view of the display panel formed on a carrier substrate taken along line IV-IV' of FIG. 7. Hereinafter, in the drawings, the same reference numerals denote the same elements, and thus, repeated descriptions thereof are omitted.

The display panel 10 according to an embodiment may be manufactured through a method of forming the display panel 10 on a carrier substrate 20 including a hard glass material and separating the display panel 10 from the carrier substrate 20. FIGS. 7 and 8 show a process of forming the display panel 10 on the carrier substrate 20 and show the display panel 10 before a process of separating the display panel 10 from the carrier substrate 20 is performed. In addition, an additional layer 50 may be arranged between the display panel 10 and the carrier substrate 20.

For convenience of description, although it is shown in FIGS. 7 to 11 that the display panel 10 includes only the panel substrate 100 and the display layer DISL on the panel substrate 100, the inventive concepts are not limited thereto. As an example, as described above with reference to FIG. 2, one or more functional layers may be arranged on the display layer DISL. The functional layer may include a touchscreen layer TSL and/or an optical functional layer OFL. Various functional layers may be arranged depending on the design. In addition, unlike FIGS. 7 to 11, the panel substrate 100 may have a multi-layered structure.

A method of manufacturing the display panel according to an embodiment may include forming the additional layer 50 on the carrier substrate 20, forming the display panel 10 on the additional layer 50, and separating the display panel 10 from the carrier substrate 20.

The additional layer 50 is a layer arranged between the panel substrate 100 of the display panel 10 and the carrier substrate 20. The additional layer 50 may facilitate separation (or layer detachment) of the display panel 10 from the carrier substrate 20. In an embodiment, the additional layer 50 may facilitate separation (or layer detachment) of the bottom surface of the panel substrate 100 of the display panel 10 from the top surface of the carrier substrate 20.

In an embodiment, the additional layer 50 may include a first layer 51 and a second layer 52. In this case, an operation of forming the additional layer 50 on the carrier substrate 20 may include an operation of sequentially forming the first layer 51 and the second layer 52 on the top surface of the carrier substrate 20 such that the bottom surfaces of the first layer 51 and the second layer 52 face the carrier substrate 20.

The first layer 51 may be arranged between the panel substrate 100 of the display panel 10 and the carrier substrate 20. The first layer 51 has a relatively high absorbance and may absorb a laser beam during a process of separating the panel substrate 100 from the carrier substrate 20. A detailed description thereof is provided below with reference to FIG. 10.

The second layer 52 may be arranged between the first layer 51 and the panel substrate 100. The second layer 52 may alleviate bonding force between the first layer 51 and the panel substrate 100. That is, the first layer 51 may be coupled to the panel substrate 100 through the second layer 52 therebetween without directly contacting the panel substrate 100. In the case where the first layer 51 directly contacts the panel substrate 100 and is coupled to the panel substrate 100, a stronger bonding force than required may be obtained due to dipole coupling between the first layer 51 and the panel substrate 100. This makes it difficult for the bottom surface of the panel substrate 100 to be separated from the top surface of the first layer 51 during a process of separating the panel substrate 100 from the carrier substrate 10, and thus, the panel substrate 100 may be damaged during the separation process. This is described below in detail with reference to FIG. 11.

In an embodiment, the first layer 51 and the second layer 52 may be formed through the same method. In an embodiment, the operation of sequentially forming the first layer 51 and the second layer 52 may include an operation of forming the first layer 51 and the second layer 52 through chemical vapor deposition (CVD) in the same chamber. Because the first layer 51 and the second layer 52 are formed through the same method in the same chamber, the first layer 51 and the second layer 52 may have the same pattern. That is, a planar area of the first layer 51 may be the same as a planar area of the second layer 52. In addition, the lateral surface of the first layer 51 and the lateral surface of the second layer 52 may not have a step difference.

Subsequently, the display panel 10 is formed on the additional layer 50. In an embodiment, the panel substrate 100 is formed on the top surface of the second layer 52 such that the bottom surface of the panel substrate 100 faces the second layer 52. The display layer DISL is formed on the panel substrate 100. In addition, one or more functional layers TSL and OFL may be additionally formed on the display layer DISL when needed.

In an embodiment, the panel substrate 100 may cover the additional layer 50. The planar area of the panel substrate 100 may be greater than the planar area of the additional layer 50. In an embodiment, the first base layer 101 of the panel substrate 100 may cover the top surface of the second layer 52, the lateral surface of the second layer 52, and the first layer 51. In addition, the planar area of the first base layer 101 of the panel substrate 100 may be greater than the planar area of the first layer 51 and/or the planar area of the second layer 52.

When the display panel 10 is completely formed on the carrier substrate 20, a process of separating the display panel 10 from the carrier substrate 20 is performed. Hereinafter, the process of separating the display panel 10 from the carrier substrate 20 is described in detail with reference to FIGS. 9 to 11.

Figure 9:
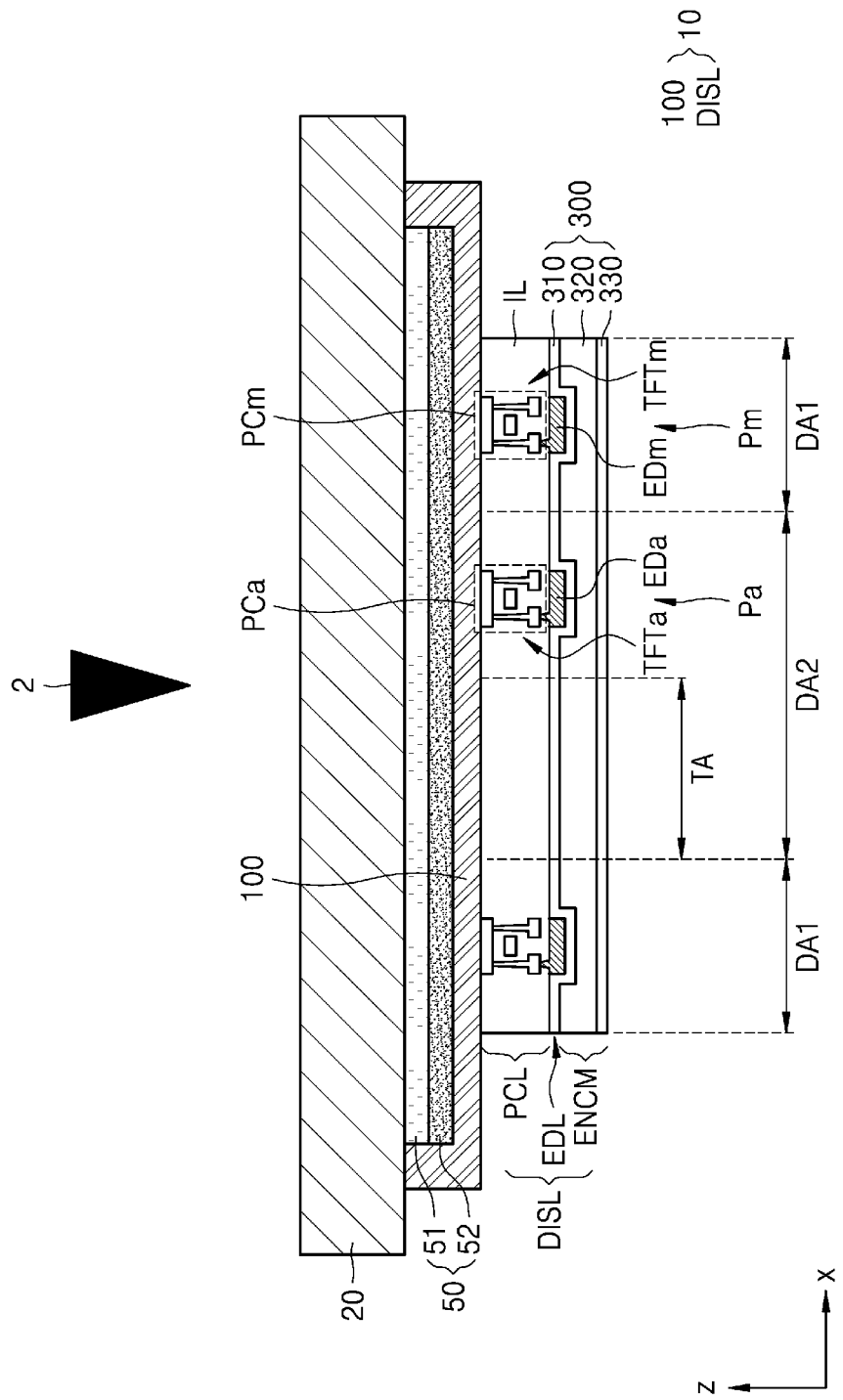
FIGS. 9, 10, and 11 are cross-sectional views sequentially showing a portion of a method of manufacturing a display panel according to an embodiment.
Figure 10:
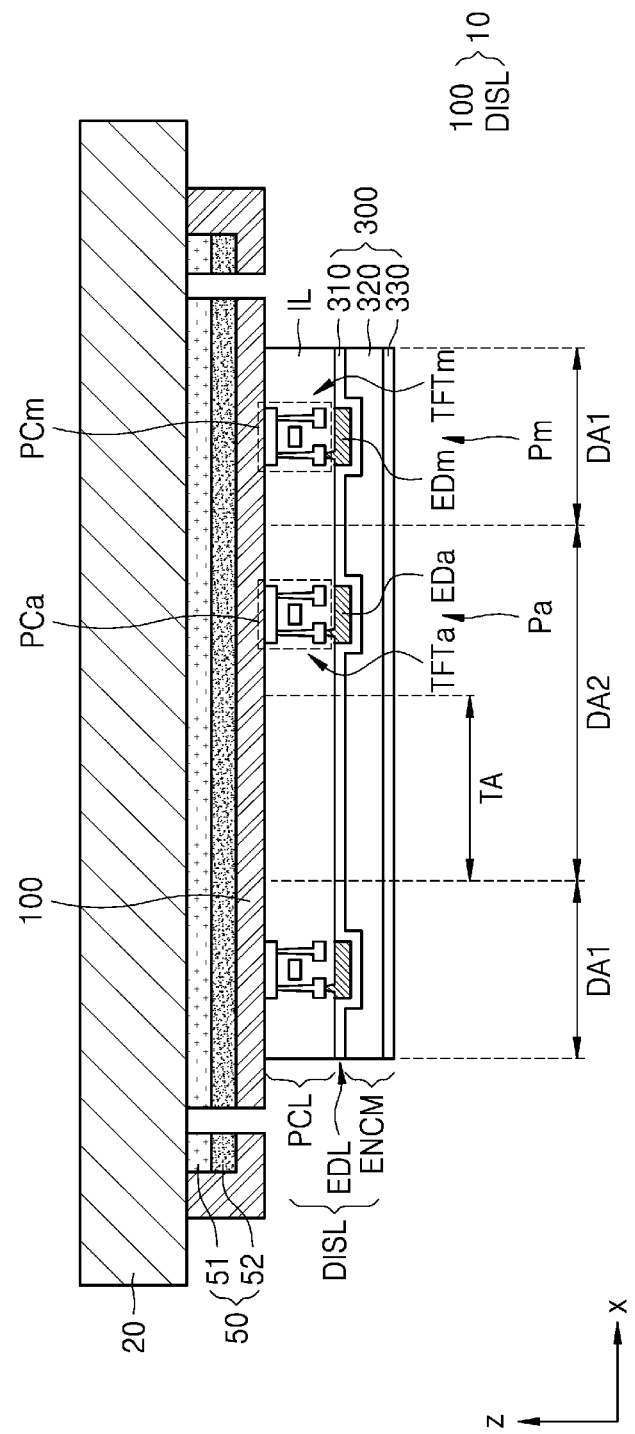
Figure 11:
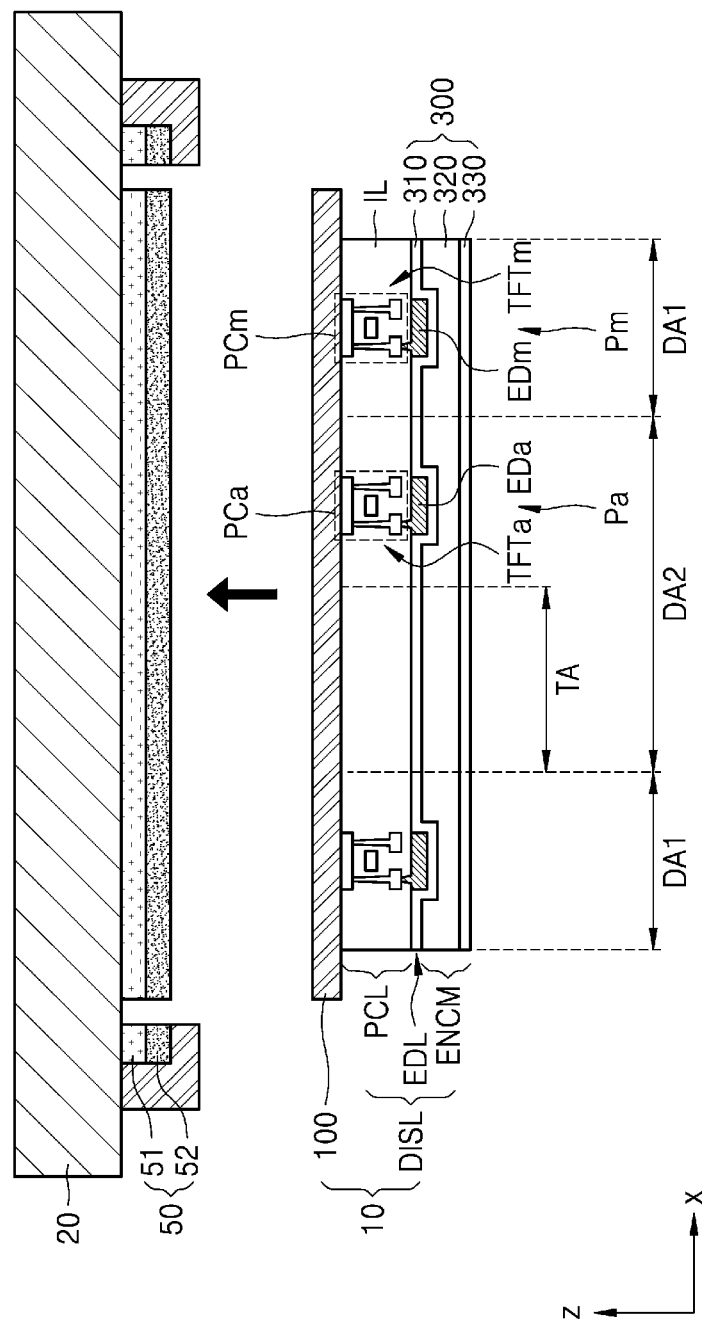

FIGS. 9 to 11 are cross-sectional views sequentially showing a portion of a method of manufacturing the display panel 10 according to an embodiment.

In the method of manufacturing the display panel 10 according to an embodiment, an operation of separating the panel substrate 100 from the carrier substrate 20 may include an operation of separating the panel substrate 100 from the second layer 52. In addition, the operation of separating the panel substrate 100 from the second layer 52 may include a layer-detaching process, a cutting process, and a separation process.

Though it is shown in FIGS. 9 to 11 that the operation of separating the panel substrate 100 from the carrier substrate 20 is performed while the bottom surface of the carrier substrate 20 is arranged in a top direction (a (+) z-direction), the inventive concepts are not limited thereto. That is, unlike FIGS. 9 to 11, the operation of separating the panel substrate 100 from the carrier substrate 20 may be performed while the bottom surface of the carrier substrate 20 is arranged in a bottom direction (a (−) z-direction), Referring to FIG. 9, a layer-detaching process is an operation of detaching the bottom surface of the first base layer 101 from the top surface of the second layer 52. A laser is applicable to the layer-detaching process. In an embodiment, the layer-detaching process may include an operation of irradiating, at a laser unit 2, a laser beam to the bottom surface of the carrier substrate 20. Although the laser unit 2 may be a laser unit that may irradiate an excimer laser beam, a solid-state laser beam, etc., the inventive concepts are not limited thereto. In the case where a solid-state laser is applied to the layer-detaching process, the transparency of the panel substrate 100 may be prevented from being deteriorated due to change or damage to the base layer when an excimer laser is applied.

In an embodiment, a laser beam irradiated by the laser unit 2 is a solid-state laser and may include a nano-second laser and femto-second laser. As an example, a laser beam may be a 343 nm-solid-state laser beam. In the case where the base layer of the panel substrate 100 includes a transparent polyimide resin, the base layer may have a low absorbance for light in a specific wavelength band. In an embodiment, the panel substrate 100 including a transparent polyimide resin has an absorbance of about 0.93 in a wavelength band of about 343 nm. In contrast, the panel substrate 100 including an opaque polyimide resin may have an absorbance of about 5.20 in the same wavelength band. In the case where an absorbance of the base layer is low, the base layer may not sufficiently absorb a laser beam during a layer-detaching process, and thus, a region in which a layer is not detached or a layer is insufficiently detached may occur. These regions may damage the panel substrate 100 or cause defects or performance deterioration of the display apparatus. In addition, in the case where a larger amount of laser energy is supplied to prevent this, whitening of transparent polyimide of the panel substrate 100 may occur, and thus, a transparency of the panel substrate 100 may be reduced.

In contrast, according to an embodiment, the first layer 51 may be arranged between the panel substrate 100 and the carrier substrate 20 to compensate for a low absorbance of the panel substrate 100. The first layer 51 may absorb at least a portion of a laser beam irradiated during a layer-detaching process in place of the panel substrate 100 having a low absorbance. Energy of a laser beam absorbed by the first layer 51 may be transferred to the first base layer 101 through the second layer 52. That is, the first base layer 101 indirectly absorbs the energy of the laser beam through the first layer 51 and may be detached from the top surface of the second layer 52 by the energy.

In an embodiment, an absorbance of the first layer 51 may be greater than an absorbance of the panel substrate 100. In an embodiment, an absorbance of the first layer 51 may be greater than an absorbance of the first base layer 101 that contacts the second layer 52. The first layer 51 may include a material having a high absorbance such as amorphous silicon.

In the case where the bottom surface of the panel substrate 100, that is, the bottom surface of the first base layer 101, is excessively strongly coupled to the top surface of the second layer 52, the first base layer 101 may not be swiftly detached from the second layer 52. To prevent this, according to an embodiment, the second layer 52 may be arranged between the first layer 51 and the panel substrate 100, and thus, the first layer 51 may be coupled to the panel substrate 100 with a bonding force that meets a range set in advance. The second layer 52 allows the first layer 51 and the panel substrate 100 to be coupled with an appropriate level of bonding force, and thus, allows the panel substrate 100 to be separated without damage. As an example, the second layer 52 may couple the first layer 51 to the panel substrate 100 with a reduced adhesive force in the range of about 5 gf/inch to about 10 dg/inch.

As an example, the bonding force between the second layer 52 and the panel substrate 100 may be less than the bonding force between the first layer 51 and the panel substrate 100. In an embodiment, the bonding force between the second layer 52 and the first base layer 101 of the panel substrate 100 may be less than the bonding force between the first layer 51 and the first base layer 101 of the panel substrate 100. For this purpose, a dielectric constant of the second layer 52 may be less than a dielectric constant of the first layer 51. That is, because the second layer 52 having a relatively low dielectric constant contacts the panel substrate 100, excessively strong coupling between the first layer 100 and the pane substrate 100 may be prevented compared to the case where the first layer 51 having a relatively high dielectric constant contacts the panel substrate 100. The second layer 52 may include a material having a relatively low dielectric constant such as silicon oxide.

Referring to FIG. 10, a cutting process is an operation of cutting the edge of the panel substrate 100 in which the bottom surface of the first base layer 101 and the top surface of the second layer 52 have been detached. Because the edge of the panel substrate 100 is cut, the panel substrate 100 may include a separation area and a residual area. Here, the separation area may denote an area that is separated from the carrier substrate 20 during a separation process below. The residual area may denote an area that is not separated from the carrier substrate 20 and remains during the separation process below. That is, the display panel 10 to be separated from the carrier substrate 20 through the cutting process may be defined. The cutting process may be performed before the layer-detaching process. That is, there is no limit in the order in which the layer-detaching process shown in FIG. 9 and the cutting process shown in FIG. 10 are performed.

Elements arranged on the carrier substrate 20 in an area that overlaps a cutting line of the cutting process may be removed. As an example, as shown in FIG. 10, in an area that overlaps a cutting line, the panel substrate 100, the second layer 52, and the first layer 51 are removed, and only the carrier substrate 20 is maintained. The cutting line may surround an inner area of the panel substrate 100 along the edge of the panel substrate 100. The display layer DISL may be arranged in an area inside the cutting line. That is, the planar area of the area inside the cutting line may be greater than the planar area of the display layer DISL and less than the planar area of the display panel 10.

A cutting wheel cutting unit or a laser cutting unit is applicable during the cutting process, the cutting wheel cutting unit performing cutting while directly contacting a cut object, and the laser cutting unit performing cutting without contacting a cut object by irradiating a laser beam. However, the inventive concepts are not limited thereto. Here, the laser cutting unit performs cutting by condensing a laser along a cutting line on a cut object and applying an impact on a material in the form of pulses. In this case, though a $CO_2$ layer, a YAG laser, a nano second layer, a femto second layer, a Bessel beam, or a Gaussian beam, etc. are applicable as a laser, the inventive concepts are not limited thereto.

Referring to FIG. 11, the separation process is an operation of separating the carrier substrate 20 away from the panel substrate 100. During the cutting process, the display panel 10 arranged in the area inside the cutting line is separated from the carrier substrate 20. In an embodiment, the display panel 10 and/or the carrier substrate 20 may be adsorbed through an adsorption unit, and the display panel 10 and/or the carrier substrate 20 may be moved in a direction away from each other. However, the separation process is not limited thereto.

As shown in FIG. 11, during the separation process, the bottom surface of the panel substrate 100 of the display panel 10 is separated from the top surface of the second layer 52. Accordingly, in an area in which the bottom surface of the panel substrate 100 is detached from the top surface of the second layer 52, the first layer 51 and the second layer 52 may still remain on the carrier substrate 20, and only the display panel 10 may be separated from the carrier substrate 20. Accordingly, the first layer 51 and the second layer 52 are not present in the display panel 10 that is separated from the carrier substrate 20 finally. As described above, even though a layer serving as the additional layer 50 is not separately provided in the multi-layered structure of the panel substrate 100, the display panel 10 may be manufactured by using the additional layer 50 that is present during only the manufacturing process, and thus, light transmittance of the display panel 10 may be improved and a thickness of the display panel 10 may be reduced.

Figure 12:
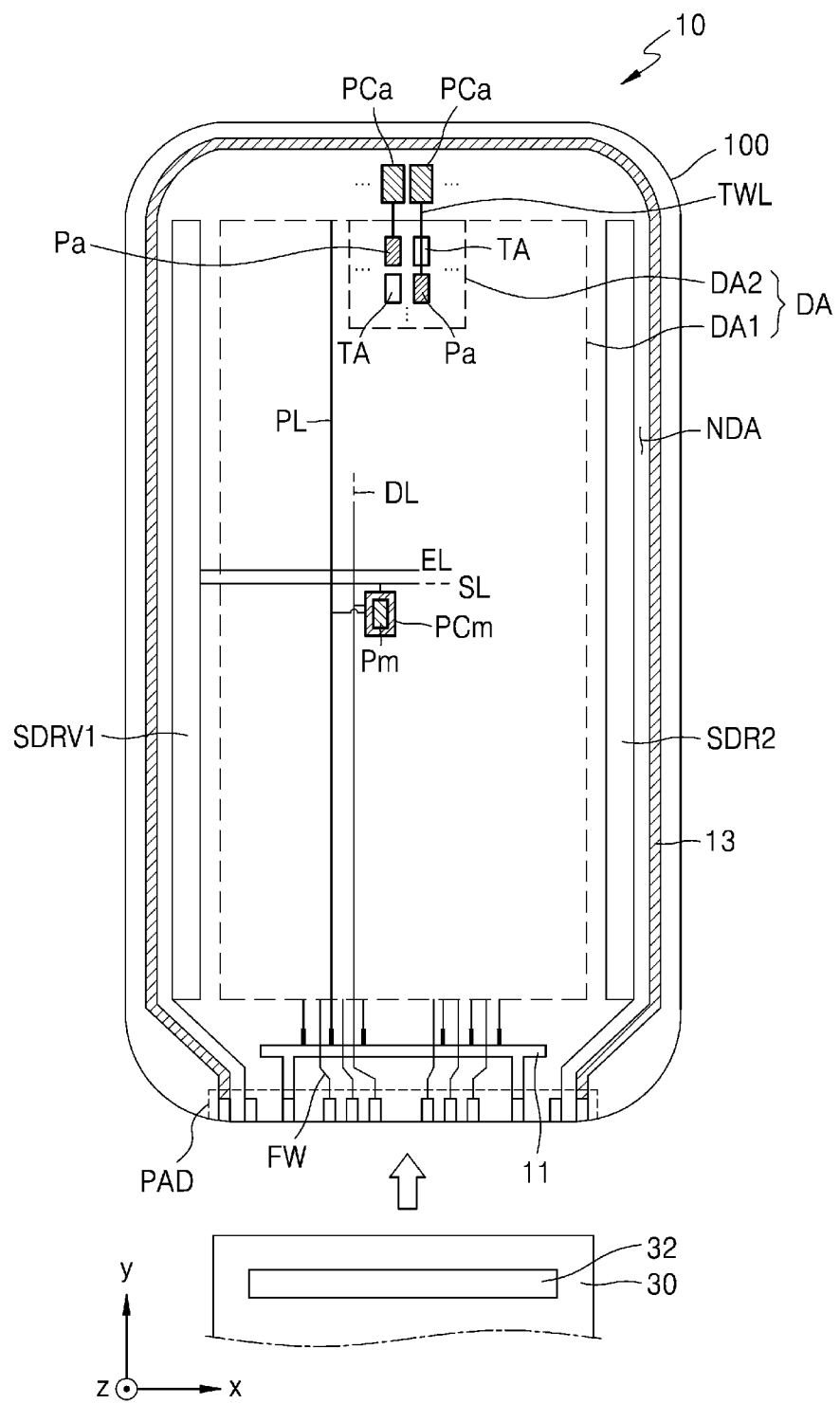
FIG. 12 is a plan view of a portion of a display panel of a display apparatus according to an embodiment.
Figure 13:
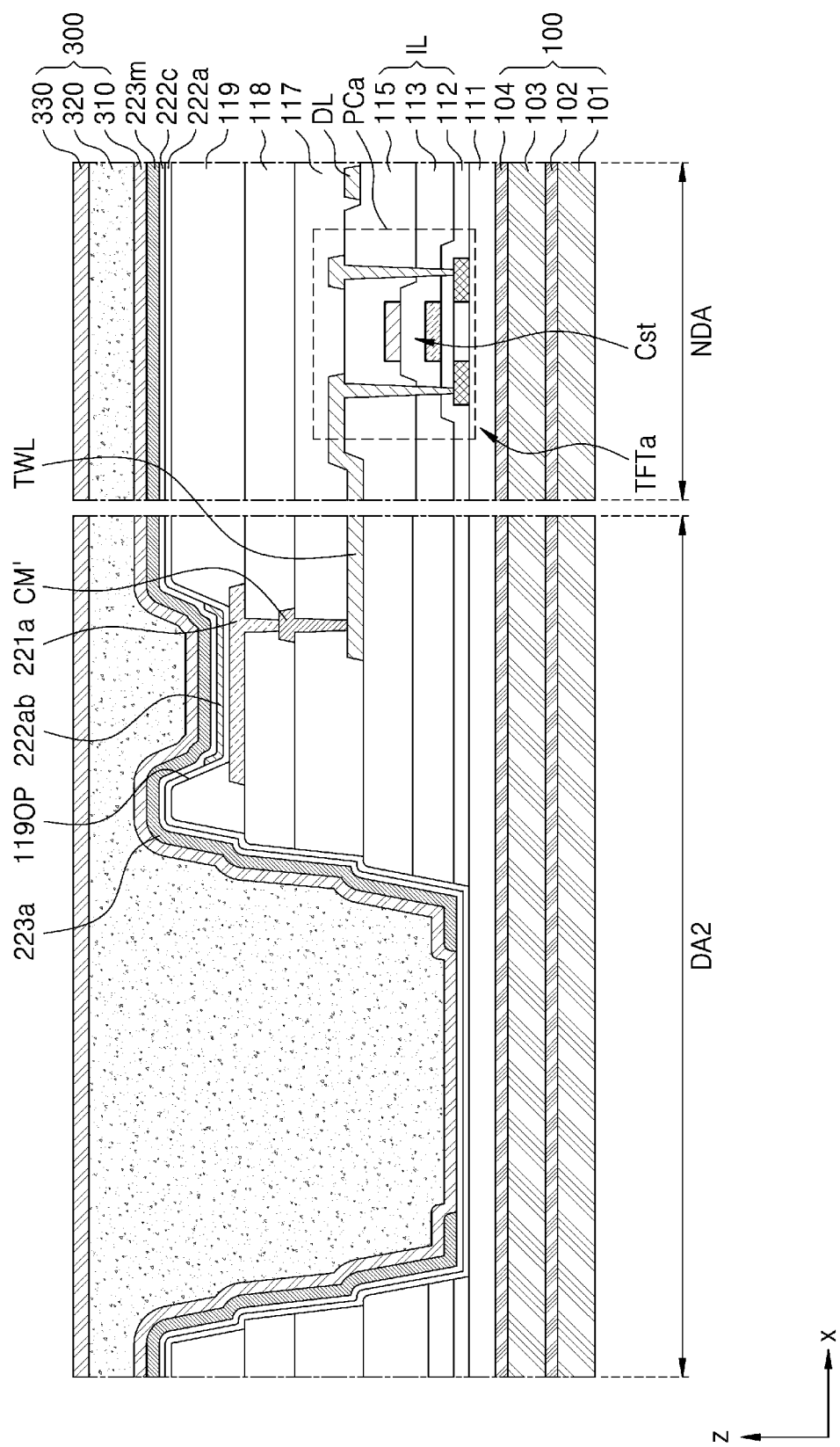
FIG. 13 is a cross-sectional view of a portion of a display apparatus according to an embodiment.

FIG. 12 is a plan view of a portion of the display panel 10 of a display apparatus according to an embodiment, and FIG. 13 is a cross-sectional view of a portion of a display apparatus according to an embodiment.

Up to this point, although a description has been made to the case where the second pixel circuit PCa electrically connected to the second sub-pixel Pa in the second display area DA2 is arranged inside the second display area DA2, the inventive concepts are not limited thereto. That is, as shown in FIG. 12, the second pixel circuit PCa electrically connected to the second sub-pixel Pa in the second display area DA2 may be arranged in the non-display area NDA. The second pixel circuit PCa may include the second thin-film transistor TFTa including the second semiconductor layer and the second gate electrode.

Even in this case, the plurality of first sub-pixels Pm may be arranged in the first display area DA1. In addition, the first pixel circuit PCm that drives the first sub-pixel Pm may be arranged in the first display area DA1, and may overlap the first sub-pixel Pm. In addition, the second pixel circuit PCa that drives the plurality of second sub-pixels Pa in the second display area DA2 may be arranged in the non-display area NDA adjacent to the second display area DA2. In an embodiment, the first thin-film transistors TFTm may be arranged over the panel substrate 100 in the first display area DA1, the first thin-film transistors TFTm being electrically connected to the first pixel electrode 221m and including the first semiconductor layer and the first gate electrode. The second thin-film transistors TFTa may be arranged over the panel substrate 100 in the non-display area NDA, the second thin-film transistors TFTa including the second semiconductor layer and the second gate electrode. In addition, connection wirings TWL may be provided, the connection wirings TWL electrically connecting the second thin-film transistors TFTa to the second pixel electrodes 221a.

As shown in FIG. 12, in the case where the second display area DA2 is arranged on the top side (a (+) y-direction) of the display area DA, the second pixel circuit PCa may be arranged in the non-display area NDA on the top side. The second pixel circuit PCa may be connected to a display element that implements the second sub-pixel Pa by a connection wiring TWL extending in one direction (e.g., a y-direction). Although FIG. 12 shows that the second pixel circuit PCa is arranged on the top side of the first display area DA1, the embodiment is not limited thereto. As an example, the second pixel circuit PCa may be arranged on the left side (a (−) x-direction) or the right side (a (+) x-direction) of the first display area DA1. Various modifications may be made.

As described above, in the case where the second pixel circuit PCa electrically connected to the second sub-pixel Pa in the second display area DA2 is arranged in the non-display area NDA, the second pixel electrode 221a may be connected to the second pixel circuit PCa arranged in the non-display area NDA through a connection wiring TWL.

In an embodiment, as shown in FIG. 13, the connection wiring TWL may include the same material as the source electrode S1 of the second pixel circuit PCa and have the same layer structure as the source electrode S1. That is, the connection wiring TWL may be formed by extending the source electrode S1 arranged in the non-display area NDA to the second display area DA2 from the non-display area NDA. The connection wiring TWL is not limited to the above example and may include a plurality of connection wirings. In this case, when the plurality of connection wirings are arranged on different layers, the plurality of connection wirings may be connected through contact holes. In addition, the connection wiring TWL may include a material different from that of the second pixel electrode 221a and have a layer structure different from that of the second pixel electrode 221a.

According to an embodiment, the display panel in which a panel substrate may be prevented from being transformed or damaged, and a method of manufacturing the display panel may be implemented. The scope of the inventive concepts is not limited by this effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display panel, the method comprising:
   sequentially forming a first layer and a second layer on a carrier substrate such that bottom surfaces of the first layer and the second layer face the carrier substrate;
   forming a panel substrate including a first base layer on a top surface of the second layer such that a bottom surface of the first base layer faces the second layer;
   forming a display layer on the panel substrate; and
   separating the panel substrate from the second layer, wherein:
   the separating of the panel substrate includes detaching the bottom surface of the first base layer from the top surface of the second layer; and
   a bonding force between the second layer and the first base layer in a contact state is less than a bonding force between the first layer and the first base layer in a contact state.

2. The method of claim 1, wherein the detaching of the bottom surface of the first base layer includes irradiating a laser beam to a bottom surface of the carrier substrate.

3. The method of claim 2, wherein the irradiating of the laser beam includes:
   absorbing, at the first layer, at least a portion of energy of the laser beam; and
   transferring the energy of the laser beam, in which the at least a portion thereof is absorbed, to the first base layer.

4. The method of claim 2, wherein an absorbance of the first layer is greater than an absorbance of the first base layer.

5. The method of claim 4, wherein the first layer includes amorphous silicon.

6. The method of claim 4, wherein the first base layer includes a transparent polyimide resin.

7. The method of claim 2, wherein the laser beam is a solid-state laser beam.

8. The method of claim 1, wherein a dielectric constant of the second layer is less than a dielectric constant of the first layer.

9. The method of claim 8, wherein the second layer includes silicon oxide.

10. The method of claim 1, wherein the separating of the panel substrate includes:
    cutting an edge of the panel substrate in which the bottom surface of the first base layer of the panel substrate is detached from the top surface of the second layer; and
    separating the carrier substrate away from the panel substrate.

11. The method of claim 1, wherein the sequentially forming of the first layer and the second layer includes forming the first layer and the second layer through chemical vapor deposition (CVD) inside a same chamber.

12. The method of claim 11, wherein the first layer and the second layer have a same area.

13. The method of claim 12, wherein the first base layer covers the second layer, and an area of the first base layer is greater than an area of the second layer.

14. The method of claim 1, wherein:
    the panel substrate includes a first display area, a second display area, and a non-display area, the second display area including transmissive areas; and
    the display layer includes:
    a first pixel electrode over the panel substrate in the first display area; and
    a second pixel electrode over the panel substrate in the second display area.

15. The method of claim 14, wherein:
    the display layer further includes: at least one insulating layer; and
    the at least one insulating layer includes an opening corresponding to the transmissive areas.

16. The method of claim 14, wherein the display layer further includes:
    a first thin-film transistor arranged over the panel substrate in the first display area, electrically connected to the first pixel electrode, and including a first semiconductor layer and a first gate electrode; and
    a second thin-film transistor arranged over the panel substrate in the second display area, electrically connected to the second pixel electrode, and including a second semiconductor layer and a second gate electrode.

17. The method of claim 14, wherein the display layer further includes:
    a first thin-film transistor arranged over the panel substrate in the first display area, electrically connected to the first pixel electrode, and including a first semiconductor layer and a first gate electrode;
    a second thin-film transistor arranged over the panel substrate in the non-display area, and including a second semiconductor layer and a second gate electrode; and
    a connection wiring electrically connecting the second thin-film transistor to the second pixel electrode.

18. A display panel manufactured by the method of claim 1.

* * * * *